United States Patent
Qian et al.

(10) Patent No.: US 10,657,866 B2
(45) Date of Patent: May 19, 2020

(54) DISPLAY DEVICE, GATE DRIVE CIRCUIT, SHIFT REGISTER AND CONTROL METHOD FOR THE SAME

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Xianrui Qian, Beijing (CN); Yuting Chen, Beijing (CN); Zixuan Wang, Beijing (CN); Bo Li, Beijing (CN); Fei Li, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/252,992

(22) Filed: Jan. 21, 2019

(65) Prior Publication Data
US 2019/0311667 A1 Oct. 10, 2019

(30) Foreign Application Priority Data

Apr. 10, 2018 (CN) .......................... 2018 1 0315427

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0286* (2013.01); *G09G 2310/06* (2013.01)

(58) Field of Classification Search
CPC ... G09G 2310/0267; G09G 2310/0286; G09G 2310/06; G09G 2320/041; G09G 3/20; G09G 3/3266; G09G 3/3674; G11C 19/28; G11C 7/02; G11C 7/04
USPC .................................. 345/87, 100, 210–213
See application file for complete search history.

(56) References Cited

U.S. PATENT DOCUMENTS

| | | | |
|---|---|---|---|
| 10,043,461 B2 * | 8/2018 | Wang | G09G 3/3611 |
| 2010/0166136 A1 * | 7/2010 | Tobita | G11C 19/184 377/67 |
| 2014/0093028 A1 * | 4/2014 | Wu | G11C 19/28 377/64 |

(Continued)

*Primary Examiner* — Tony O Davis
(74) *Attorney, Agent, or Firm* — Myers Bigel, P.A.

(57) ABSTRACT

A display device, a gate drive circuit, a shift register and its control method are described. The shift register includes: an input circuit, a first output circuit, a second output circuit, a control circuit and an output drive circuit, wherein the output drive circuit is connected to a second signal input terminal, a pull-up node, a control terminal of the second output circuit and a low voltage signal terminal, and is configured to write a voltage of the second signal input terminal into the control terminal of the second output circuit and superimpose a voltage of the pull-up node onto the control terminal of the second output circuit under the control of a second input signal provided at the second signal input terminal, such that the second output circuit is fully turned on to ensure that it has good output capability when working at a low temperature.

20 Claims, 4 Drawing Sheets

(56) References Cited

U.S. PATENT DOCUMENTS

| | | | | |
|---|---|---|---|---|
| 2014/0119493 A1* | 5/2014 | Yang | ...................... | G11C 19/28 377/64 |
| 2015/0255031 A1* | 9/2015 | Cao | ...................... | G09G 3/3677 345/210 |
| 2015/0302934 A1* | 10/2015 | Qi | ...................... | G11C 19/184 377/54 |
| 2015/0365085 A1* | 12/2015 | Qing | ................... | H03K 17/302 345/100 |
| 2016/0125955 A1* | 5/2016 | Pang | ................... | G11C 19/287 377/64 |
| 2016/0307641 A1* | 10/2016 | Zheng | ................. | G09G 3/3677 |
| 2016/0372070 A1* | 12/2016 | Hu | ....................... | G09G 3/3614 |
| 2017/0178558 A1* | 6/2017 | Zhou | ...................... | G09G 3/20 |
| 2017/0193889 A1* | 7/2017 | Li | ........................... | G09G 3/20 |
| 2017/0301276 A1* | 10/2017 | He | ...................... | G09G 3/2092 |
| 2017/0309240 A1* | 10/2017 | Zhang | ................. | G11C 19/184 |
| 2017/0330526 A1* | 11/2017 | Fan | ..................... | G09G 3/3677 |
| 2018/0025687 A1* | 1/2018 | Wang | ................... | G09G 3/3696 345/213 |
| 2018/0040382 A1* | 2/2018 | Gu | ....................... | G09G 3/3674 |
| 2018/0144677 A1* | 5/2018 | Zhang | ................. | G09G 3/2092 |
| 2018/0174659 A1* | 6/2018 | Shao | ................... | G09G 3/3677 |
| 2018/0190232 A1* | 7/2018 | Xue | .................... | G09G 3/3677 |
| 2018/0211606 A1* | 7/2018 | Zhang | .................... | G09G 3/34 |
| 2018/0218688 A1* | 8/2018 | Chen | .................... | G09G 3/3266 |
| 2018/0226132 A1* | 8/2018 | Gao | ...................... | G09G 3/3677 |
| 2018/0293924 A1* | 10/2018 | Wang | ........................ | G09G 3/20 |
| 2018/0336957 A1* | 11/2018 | Mi | ........................ | G11C 19/287 |
| 2018/0342187 A1* | 11/2018 | Shan | ........................ | G09G 3/20 |
| 2019/0057637 A1* | 2/2019 | Fan | .......................... | G09G 3/20 |
| 2019/0057638 A1* | 2/2019 | Kim | ..................... | G09G 3/3677 |
| 2019/0057755 A1* | 2/2019 | Xiong | ................... | G11C 19/184 |
| 2019/0066617 A1* | 2/2019 | Zhao | .................... | G09G 3/3677 |
| 2019/0096350 A1* | 3/2019 | Zhao | .................... | G09G 3/3677 |
| 2019/0103067 A1* | 4/2019 | Kim | ..................... | G09G 3/3677 |
| 2019/0115090 A1* | 4/2019 | Tao | ...................... | G11C 19/287 |
| 2019/0139616 A1* | 5/2019 | Qian | ..................... | G11C 19/28 |
| 2019/0156778 A1* | 5/2019 | Li | ......................... | G11C 19/28 |
| 2019/0180834 A1* | 6/2019 | Yuan | .................... | G11C 19/28 |
| 2019/0189233 A1* | 6/2019 | Su | .......................... | G11C 19/28 |
| 2019/0214104 A1* | 7/2019 | Qian | .................... | G11C 19/28 |
| 2019/0272884 A1* | 9/2019 | Liao | .................... | G11C 19/184 |
| 2019/0287447 A1* | 9/2019 | Zheng | ................... | G09G 3/3677 |
| 2019/0295674 A1* | 9/2019 | Zhang | ................... | G11C 19/287 |
| 2019/0304393 A1* | 10/2019 | Wang | ................... | G09G 3/3677 |
| 2019/0311691 A1* | 10/2019 | Feng | .................... | G09G 3/3677 |
| 2019/0325836 A1* | 10/2019 | Qian | .................... | G11C 19/28 |
| 2019/0355432 A1* | 11/2019 | Su | .......................... | G11C 19/28 |
| 2019/0371224 A1* | 12/2019 | Tao | ...................... | G11C 19/28 |
| 2019/0392916 A1* | 12/2019 | Gu | ...................... | G11C 19/287 |

* cited by examiner in a first stage, inputting a first turn-on voltage into the first clock signal terminal, inputting a second turn-off voltage into the second clock signal terminal, inputting a third voltage into the first signal input terminal, and inputting a fourth voltage into the second signal input terminal, so that the first capacitor in the output drive circuit is charged by the fourth voltage input into the second signal input terminal, then the voltage of the control terminal of the second output circuit is the charging voltage of the first capacitor ⎯ S1 in a second stage, inputting a first turn-off voltage into the first clock signal terminal, inputting a second turn-on voltage into the second clock signal terminal, inputting a fourth voltage into the first signal input terminal, and inputting a third voltage into the second signal input terminal, so that the voltage of the first signal input terminal is written into the pull-up node to make the voltage on the control terminal of the second output circuit to be a sum of the voltage of the pull-up node and the charging voltage of the first capacitor ⎯ S2 in a third stage, inputting the first turn-on voltage into the first clock signal terminal, inputting the second turn-off voltage into the second clock signal terminal, inputting the third voltage into both the first signal input terminal and the second signal input terminal, so that the voltage of the first clock signal terminal is written into the second signal output terminal through the second output circuit ⎯ S3

FIG.6

DISPLAY DEVICE, GATE DRIVE CIRCUIT, SHIFT REGISTER AND CONTROL METHOD FOR THE SAME

CROSS REFERENCE TO RELATED APPLICATIONS

This U.S. non-provisional patent application claims priority under 35 U.S.C. § 119 to Chinese Patent Application No. 201810315427.9 filed on Apr. 10, 2018, the entire disclosure of which is incorporated herein by reference.

TECHNICAL FIELD

The present disclosure generally relates to the field of display technologies, and specifically to a shift register, a gate drive circuit, a display device and a method for controlling the shift register.

BACKGROUND

The basic operation principle of the gate drive circuit is to transmit driving signals downward line by line, and the driving signals of one line usually depend on the driving signals of the previous line, in this case, once any instability occurs in one line of signals, it will be transmitted downward line by line and amplification of the abnormal signals might occur, causing distortion of the driving signals provided at the gate drive circuit, as a result, abnormal display of the display device will be caused. In related technologies, signal output is controlled by turning the transistor on and off, and the magnitude of the gate voltage when the transistor is turned on completely determines the signal output capability of the gate drive circuit and determines the sustainability of signal transmission line by line. However, if the working temperature of the display device drops, the output capability of the transistor will also be weakened, then the probability of the gate drive circuit being unable to continue to output will rise, thus the stability of the gate drive circuit decreases.

SUMMARY

According to a first aspect of the present disclosure, a shift register is provided, which comprises: an input circuit connected to a first signal input terminal and an pull-up node, respectively and configured to write a voltage of the first signal input terminal into the pull-up node under the control of a first input signal provided at the first signal input terminal; a first output circuit connected to the pull-up node, a first clock signal terminal and a first signal output terminal, respectively and configured to write a voltage of the first clock signal terminal into the first signal output terminal under the control of a voltage of the pull-up node; a second output circuit connected to the first clock signal terminal and a second signal output terminal, respectively and configured to write the voltage of the first clock signal terminal into the second signal output terminal under the control of a voltage of a control terminal of the second output circuit; a control circuit connected to a second clock signal terminal, the pull-up node, a reset signal terminal, a low voltage signal terminal and the first signal output terminal, respectively and configured to control voltages of the first signal output terminal and the pull-up node under the control of a second clock signal provided at the second clock signal terminal and a voltage of the reset signal terminal; an output drive circuit connected to a second signal input terminal, the pull-up node, a control terminal of the second output circuit and the low voltage signal terminal, respectively and configured to write a voltage of the second signal input terminal into the control terminal of the second output circuit and superimpose the voltage of the pull-up node onto the control terminal of the second output circuit under the control of a second input signal provided at the second signal input terminal.

According to an embodiment of the present disclosure, the control circuit comprises a pull-down circuit which is connected to the reset signal terminal, the low voltage signal terminal, the pull-up node and the first signal output terminal, respectively and is configured to write a voltage of the low voltage signal terminal into the first signal output terminal and the pull-up node under the control of a voltage of the reset signal terminal; a pull-down control circuit which is connected to the second clock signal terminal, the pull-up node, a pull-down node and the low voltage signal terminal, respectively and is configured to write a voltage of the second clock signal terminal into the pull-down node under the control of the second clock signal provided at the second clock signal terminal and to write the voltage of the low voltage signal terminal into the pull-down node under the control of the voltage of the pull-up node; a first denoising circuit which is connected to the pull-down node, the pull-up node, the low voltage signal terminal and the first signal output terminal, respectively and is configured to denoise the pull-up node and the first signal output terminal under the control of a voltage of the pull-down node.

According to an embodiment of the present disclosure, the control circuit further comprises a second denoising circuit which is connected to the pull-up node, the first signal input terminal, the low voltage signal terminal, the first signal output terminal and the second clock signal terminal, respectively and is configured to denoise the first signal output terminal according to the second clock signal provided at the second clock signal terminal.

According to an embodiment of the present disclosure, the output drive circuit comprises: a first transistor with its first terminal and control terminal connected to the second signal input terminal and its second terminal connected to a control terminal of the second output circuit; a second transistor with its first terminal connected to the control terminal of the second output circuit, its second terminal connected to the low voltage signal terminal, and its control terminal connected to the second signal input terminal; a third transistor with its first terminal connected to the pull-up node, its second terminal connected to the low voltage signal terminal, and its control terminal connected to the second signal input terminal; and a first capacitor with its first terminal connected to the pull-up node and its second terminal connected to the control terminal of the second output circuit.

According to an embodiment of the present disclosure, the second output circuit comprises: a fourth transistor with its first terminal connected to the first clock signal terminal, its second terminal connected to the second signal output terminal, and its control terminal serving as the control terminal of the second output circuit.

According to an embodiment of the present disclosure, the first output circuit comprises: a fifth transistor with its first terminal connected to the first clock signal terminal, its second terminal connected to the first signal output terminal, and its control terminal connected to the pull-up node; a second capacitor with its one terminal connected to the pull-up node and the other terminal connected to the first signal output terminal.

According to an embodiment of the present disclosure, the pull-down control circuit comprises a first pull-down control sub-circuit and a second pull-down control sub-circuit; and wherein the second pull-down control sub-circuit is connected to the second clock signal terminal, the pull-down control node and the pull-down node, respectively and is configured to change the voltage of the pull-down control node under the control of the second clock signal provided at the second clock signal terminal, and the first pull-down control sub-circuit is connected to the pull-down control node, the pull-up node, the pull-down node and the low voltage signal terminal, respectively and is configured to change the voltage of the pull-down node under the control of the pull-up node and the pull-down control node; wherein the second pull-down control sub-circuit comprises a sixth transistor and a seventh transistor, a control terminal and a first terminal of the sixth transistor being connected to the second clock signal terminal, a second terminal of the sixth transistor being connected to the pull-down control node, a first terminal of the seventh transistor being connected to the pull-down node, a second terminal of the seventh transistor being connected to the second clock signal terminal, and a control terminal of the seventh transistor being connected to the pull-down control node; the first pull-down control sub-circuit comprises an eighth transistor and a ninth transistor, a first terminal of the eighth transistor being connected to the low voltage signal terminal, a second terminal of the eighth transistor being connected to the pull-down node, a control terminal of the eighth transistor being connected to the pull-up node, a first terminal of the ninth transistor being connected to the pull-down control node, a second terminal of the ninth transistor being connected to the low voltage signal terminal, and a control terminal of the ninth transistor being connected to the pull-up node.

According to an embodiment of the present disclosure, the first denoising circuit comprises: a tenth transistor with its first terminal connected to the low voltage signal terminal, its second terminal connected to the first signal output terminal, and its control terminal connected to the pull-down node; and an eleventh transistor with its first terminal connected to the low voltage signal terminal, its second terminal connected to the pull-up node, and its control terminal connected to the pull-down node.

According to an embodiment of the present disclosure, the second denoising circuit comprises: a twelfth transistor with its first terminal connected to the first signal output terminal, its second terminal connected to the low voltage signal terminal, and its control terminal connected to the second clock signal terminal; and a thirteenth transistor with its first terminal connected to the first signal input terminal, its second terminal connected to the pull-up node, and its control terminal connected to the second clock signal terminal.

According to an embodiment of the present disclosure, the pull-down circuit comprises: a fourteenth transistor with its first terminal connected to the first signal output terminal, its second terminal connected to the low voltage signal terminal, and its control terminal connected to the reset signal terminal; and a fifteenth transistor with its first terminal connected to the pull-up node, its second terminal connected to the low voltage signal terminal and its control terminal connected to the reset signal terminal According to an embodiment of the present disclosure, the input circuit comprises: a sixteenth transistor with its first terminal and control terminal connected to the first signal input terminal, and its second terminal connected to the pull-up node.

According to a second aspect of the present disclosure, a gate drive circuit is provided, which comprises multiple stages of any of the above-mentioned shift registers, wherein except for the shift register of the first stage, the first signal input terminal of the shift register of each of the rest stages is connected to the second signal output terminal of the shift register of the previous stage; and except for shift registers of the first stage and the second stage, the second signal input terminal of the shift register of each of the rest stages is connected to the second signal output terminal of the shift register before the shift register of the previous stage.

According to a third aspect of the present disclosure, a display device is provided, which comprises the gate drive circuit.

According to a fourth aspect of the present disclosure, a method for controlling the shift register is provided, which comprises: in a first stage, inputting a first turn-on voltage into the first clock signal terminal, inputting a second turn-off voltage into the second clock signal terminal, inputting a third voltage into the first signal input terminal, and inputting a fourth voltage into the second signal input terminal, so that the first capacitor in the output drive circuit is charged by the fourth voltage input into the second signal input terminal and that the voltage of the control terminal of the second output circuit is a charging voltage of the first capacitor; in a second stage, inputting a first turn-off voltage into the first clock signal terminal, inputting a second turn-on voltage into the second clock signal terminal, inputting a fourth voltage into the first signal input terminal, and inputting a third voltage into the second signal input terminal, so that the voltage of the first signal input terminal is written into the pull-up node to make the voltage on the control terminal of the second output circuit to be a sum of the voltage of the pull-up node and the charging voltage of the first capacitor; in a third stage, inputting the first turn-on voltage into the first clock signal terminal, inputting the second turn-off voltage into the second clock signal terminal, inputting the third voltage into both the first signal input terminal and the second signal input terminal, so that the voltage of the first clock signal terminal is written into the second signal output terminal through the second output circuit.

BRIEF DESCRIPTION OF THE DRAWINGS

FIG. 6 is a flow chart of a method for controlling the shift register according to an embodiment of the present disclosure.

DETAILED DESCRIPTION

Embodiments of the present disclosure will be described in detail below with reference to the drawings. The same or similar numerals are used throughout the drawings to denote the same or similar elements or elements having the same or similar function. The following embodiments described with reference to the drawings are merely exemplary, and they intend to explain rather than limiting the present disclosure.

The display device, gate drive circuit, shift register and control method of the shift register according to embodiments of the present disclosure will be described below in conjunction with the drawings.

Figure 1:
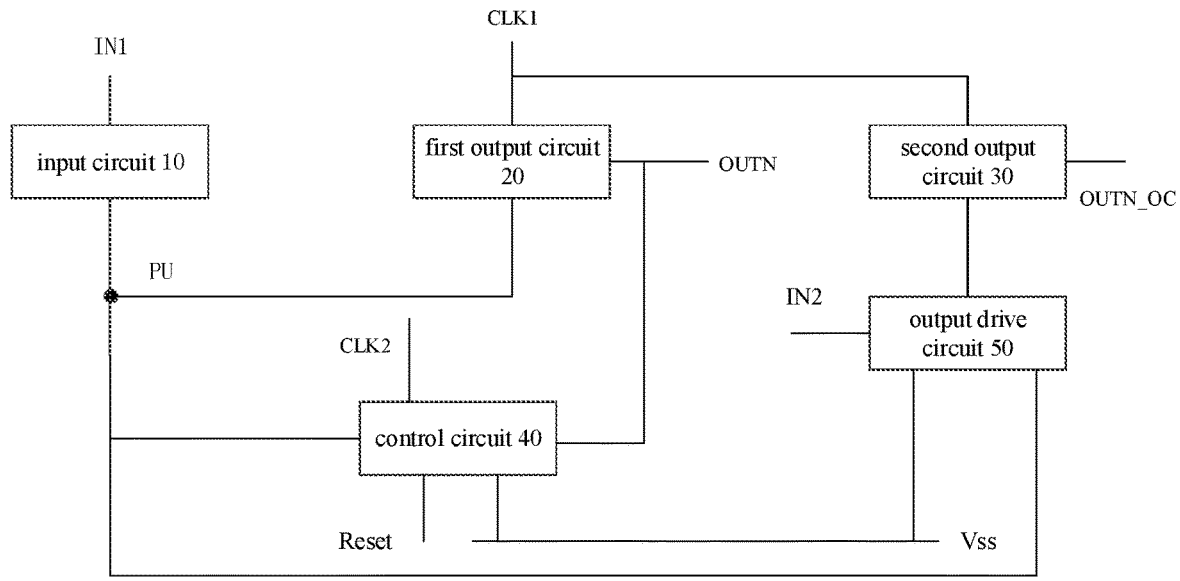
FIG. 1 is a schematic block diagram of a shift register according to an embodiment of the present disclosure.

FIG. 1 is a schematic block diagram of a shift register according to an embodiment of the present disclosure. As shown in FIG. 1, the shift register according to an embodiment of the present disclosure comprises: an input circuit 10, a first output circuit 20, a second output circuit 30, a control circuit 40 and an output drive circuit 50.

The input circuit 10 is connected to a first signal input terminal IN1 and a pull-up node PU, respectively, and is configured to write a voltage of the first signal input terminal IN1 into the pull-up node PU under the control of a first input signal provided at the first signal input terminal IN1; the first output circuit 20 is connected to the pull-up node PU, a first clock signal terminal CLK1 and a first signal output terminal OUTN, respectively and is configured to write a voltage of the first clock signal terminal CLK1 into the first signal output terminal OUTN under the control of a voltage of the pull-up node PU; the second output circuit 30 is connected to the first clock signal terminal CLK1 and a second signal output terminal OUTN_OC, respectively and is configured to write the voltage of the first clock signal terminal CLK1 into the second signal output terminal OUTN_OC under the control of a voltage of a control terminal of the second output circuit 30; the control circuit 40 is connected to a second clock signal terminal CLK2, the pull-up node PU, a reset signal terminal Reset, a low voltage signal terminal Vss and the first signal output terminal OUTN, respectively and is configured to control voltages of the first signal output terminal OUTN and the pull-up node PU under the control of a second clock signal provided at the second clock signal terminal CLK2 and a voltage of the reset signal terminal Reset; the output drive circuit 50 is connected to a second signal input terminal IN2, the pull-up node PU, a control terminal of the second output circuit 30 and the low voltage signal terminal Vss, respectively and is configured to write a voltage of the second signal input terminal IN2 into the control terminal of the second output circuit 30 and superimpose the voltage of the pull-up node PU onto the control terminal of the second output circuit 30 under the control of a second input signal provided at the second signal input terminal IN2.

It shall be noted that the first input signal of the first signal input terminal IN1 can be a pre-set input signal (at the first stage of shift register) or a signal output from the second signal output terminal of the previous stage of shift register (at shift registers other than the first stage of shift register). Besides, the second input signal of the second signal input terminal IN2 can be a pre-set input signal (at the first stage of shift register and the second stage of shift register) or a signal output from the second signal output terminal of the shift register which is before the previous stage of shift register (at shift registers other than the first stage of shift register and the second stage of shift register).

It shall also be noted that when the second output circuit 30 is turned on under the control of a positive voltage, by superimposing the voltage of the pull-up node PU onto the control terminal of the second output circuit 30, the voltage of the control terminal of the second output circuit 30 can be increased to ensure that the second output circuit 30 operates in a linear area, such that the second output circuit 30 can be fully turned on; when the second output circuit 30 is turned on under the control of a negative voltage, by superimposing the voltage of the pull-up node PU onto the control terminal of the second output circuit 30, the voltage of the control terminal of the second output circuit 30 can be decreased to ensure that the second output circuit 30 operates in the linear area, such that the second output circuit 30 can be fully turned on. In other words, by superimposing the voltage of the pull-up node PU onto the control terminal of the second output circuit 30, the absolute value of the voltage of the control terminal of the second output circuit 30 can be increased.

When the first input signal of the present stage of shift register (e.g. the $N^{th}$ stage of shift register) is provided by the previous stage of shift register (e.g. the $(N-1)^{th}$ stage of shift register), an electric potential of the pull-up node PU is written by the previous stage of shift register through the input circuit 10, as a result, the signal output capability of the second output circuit 30 influences the capability of transmission of the drive signal line by line.

In view of this, in an embodiment of the present disclosure, the output drive circuit 50 uses the second input signal provided at the second signal input terminal IN2 (the signal output from the second signal output terminal of the shift register before the previous stage of shift register (i.e. the $(N-2)^{th}$ stage of shift register)) and the first input signal provided at the first signal input terminal IN1 (the signal output from the second signal output terminal of the previous stage of shift register (i.e. the $(N-1)^{th}$ stage of shift register)) to perform double superimposition so as to fully turn on the second output circuit 30, thus the signal of the second signal output terminal of the present stage of shift register can be written quickly and fully into the pull-up node PU of the next stage of shift register, and the capability of transmission of the drive signal line by line can be enhanced significantly in a low temperature environment, accordingly, the capability of sustained output of the multiple stages of shift registers can be enhanced, and stable output of the gate drive circuit at ultra-low temperature is realized, which meets the need of product design under extreme working environments.

Specifically, the working process of the above-described shift register may include the following three stages: in the first stage, a first turn-on voltage is input into the first clock signal terminal CLK1, a second turn-off voltage is input into the second clock signal terminal CLK2, a third voltage is input into the first signal input terminal IN1, and a fourth voltage is input into the second signal input terminal IN2, so that the first capacitor in the output drive circuit 50 is charged by the fourth voltage input into the second signal input terminal IN2, then the voltage of the control terminal of the second output circuit 30 is a charging voltage of the first capacitor; in the second stage, a first turn-off voltage is input into the first clock signal terminal CLK1, a second turn-on voltage is input into the second clock signal terminal CLK2, a fourth voltage is input into the first signal input terminal IN1, and a third voltage is input into the second signal input terminal IN2, so that the voltage of the first signal input terminal IN1 is written into the pull-up node to make the voltage on the control terminal of the second output circuit 30 to be the sum of the voltage of the pull-up node PU and the charging voltage of the first capacitor; in the third stage, the first turn-on voltage is input into the first clock signal terminal CLK1, the second turn-off voltage is input into the second clock signal terminal CLK2, the third voltage is input into both the first signal input terminal IN1 and the second signal input terminal IN2, so that the voltage of the first clock signal terminal CLK1 is written into the second signal output terminal OUTN_OC through the second output circuit 30.

In a specific example of the present disclosure, the first turn-on voltage may be a high level and the first turn-off voltage may be a low level, the second turn-on voltage may be a high level and the second turn-off voltage may be a low level, the third voltage may be a low level and the fourth voltage may be a high level.

It shall be noted that the "high level" and "low level" mentioned herein refer to two kinds of logical states represented by the ranges of potential height at a certain position. For example, the high level may refer to a potential higher than a common terminal voltage, and the low level may specifically refer to a potential lower than the common terminal voltage. The "high levels" at different positions may have different potentials, and the "low levels" at different positions may also have different potentials. It shall be appreciated that the specific range of potential height can be set as desired in specific application scenarios, which is not limited herein.

To be specific, in the first stage, a high level is input into the second signal input terminal IN2, the output drive circuit 50 is turned on to charge the first capacitor. At this point, the voltage of the control terminal of the second output circuit 30 is the charging voltage of the first capacitor, i.e. a high level V1. In the second stage, a high level is input into the first signal input terminal IN1, the output drive circuit 50 is turned off and the input circuit 10 is turned on, then the high level provided at the first signal input terminal IN1 is written into the pull-up node PU through the input circuit, so that the pull-up node PU is at another high level V2. Under the effect of the first capacitor, the voltage of the control terminal of the second output circuit 30 is a sum of the voltage of the pull-up node PU and the charging voltage of the first capacitor, i.e. V1+V2. Next, in the third stage, a high level is input into the first clock signal terminal CLK1, and a low level is input into the second clock signal terminal CLK2, since the voltage of the control terminal of the second output circuit 30 is V1+V2 at this time, the second output circuit 30 is fully turned on, thus ensuring that the second output circuit 30 still has good output capability when working at a low temperature and ensuring that the second signal output terminal OUTN_OC can quickly output signals of the first clock signal terminal CLK1, thereby enhancing the capability of transmitting and outputting line by line in low temperature environment and realizing stable output at ultra-low temperature.

Figure 2:
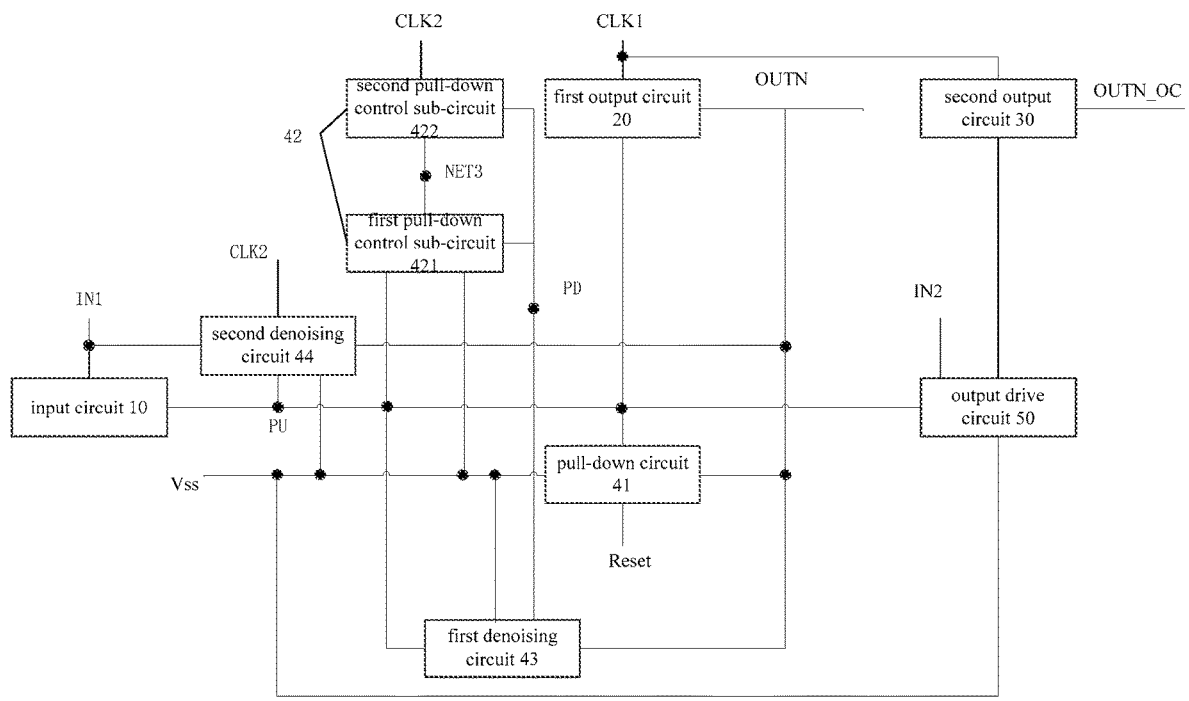
FIG. 2 is a schematic block diagram of a shift register according to an embodiment of the present disclosure.

Further, according to one embodiment of the present disclosure, as shown in FIG. 2, the control circuit 40 may include a pull-down circuit 41, a pull-down control circuit 42 and a first denoising circuit 43.

The pull-down circuit 41 is connected to the reset signal terminal Reset, the low voltage signal terminal Vss, the pull-up node PU and the first signal output terminal OUTN, respectively and is configured to write a voltage of the low voltage signal terminal Vss into the first signal output terminal OUTN and the pull-up node PU under the control of a voltage of the reset signal terminal Reset; the pull-down control circuit 42 is connected to the second clock signal terminal CLK2, the pull-up node PU, a pull-down node PD and the low voltage signal terminal Vss, respectively and is configured to write a voltage of the second clock signal terminal CLK2 into the pull-down node PD under the control of the second clock signal provided at the second clock signal terminal CLK2 and to write the voltage of the low voltage signal terminal Vss into the pull-down node PD under the control of the voltage of the pull-up node PU; the first denoising circuit 43 is connected to the pull-down node PD, the pull-up node PU, the low voltage signal terminal Vss and the first signal output terminal OUTN, respectively and is configured to denoise the pull-up node PU and the first signal output terminal OUTN under the control of a voltage of the pull-down node PD.

In some embodiments, as shown in FIG. 2, the control circuit 40 may further include a second denoising circuit 44 which is connected to the pull-up node PU, the first signal input terminal IN1, the low voltage signal terminal Vss, the first signal output terminal OUTN and the second clock signal terminal CLK2, respectively and is configured to denoise the first signal output terminal OUTN according to the second clock signal provided at the second clock signal terminal CLK2.

In some embodiments, as shown in FIG. 2, the pull-down control circuit 42 may include: a first pull-down control sub-circuit 421 and a second pull-down control sub-circuit 422, wherein the second pull-down control sub-circuit 422 is connected to the second clock signal terminal CLK2, the pull-down control node NET3 and the pull-down node PD, respectively and is configured to change the voltage of the pull-down control node NET3 under the control of the second clock signal provided at the second clock signal terminal CLK2, and the first pull-down control sub-circuit 421 is connected to the pull-down control node NET3, the pull-up node PU, the pull-down node PD and the low voltage signal terminal Vss, respectively and is configured to change the voltage at the pull-down node PD under the control of the pull-up node PU and the pull-down control node NET3.

Now the circuit structure of the shift register of the embodiments of the present disclosure will be described in detail with reference to FIG. 3.

Figure 3:
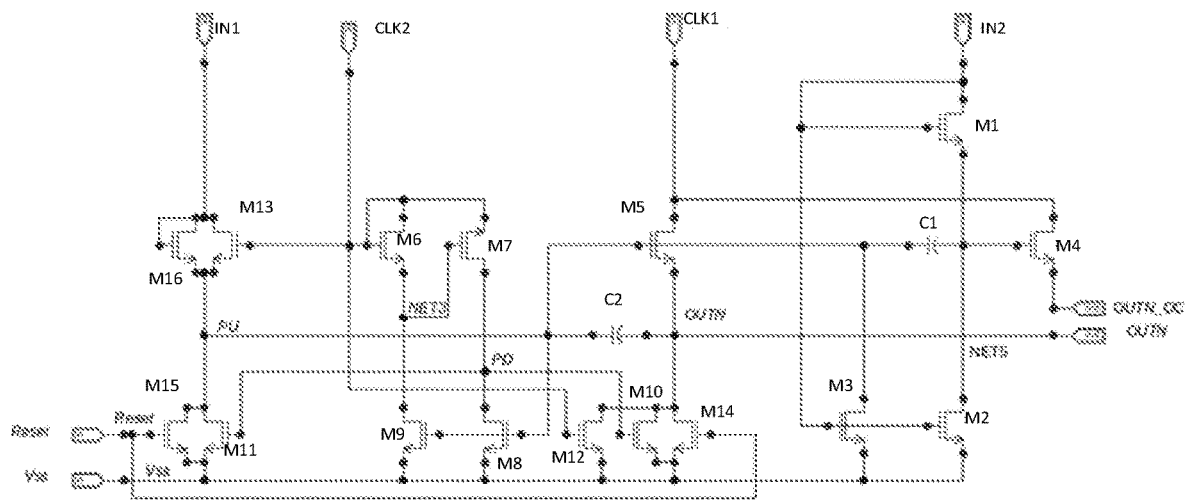
FIG. 3 is a circuit principle diagram of a shift register according to an embodiment of the present disclosure.

As shown in FIG. 3, the output drive circuit 50 comprises: a first transistor M1, a second transistor M2, a third transistor M3 and a first capacitor C1.

The first transistor M1 has its first terminal and control terminal connected to the second signal input terminal IN2, and its second terminal connected to a control terminal of the second output circuit 30; the second transistor M2 has its first terminal connected to the control terminal of the second output circuit 30, its second terminal connected to the low voltage signal terminal, and its control terminal connected to the second signal input terminal IN2; the third transistor M3 has its first terminal connected to the pull-up node, its second terminal connected to the low voltage signal terminal Vss, and its control terminal connected to the second signal input terminal IN2; and the first capacitor C1 has its first terminal connected to the pull-up node PU and its second terminal connected to the control terminal of the second output circuit 30.

The second output circuit 30 comprises: a fourth transistor M4 with its first terminal connected to the first clock signal terminal CLK1, its second terminal connected to the second signal output terminal OUTN_OC, and its control terminal serving as the control terminal of the second output circuit 30.

It shall be noted that when the fourth transistor M4 is an N-type transistor, by superimposing the voltage of the pull-up node PU onto the control terminal of the fourth transistor M4, the voltage of the control terminal of the fourth transistor M4 can be increased to ensure that the fourth transistor M4 operates in a linear area, such that the fourth transistor M4 can be fully turned on; when the fourth transistor M4 is a P-type transistor, by superimposing the voltage of the pull-up node PU onto the control terminal of the fourth transistor M4, the voltage of the control terminal of the fourth transistor M4 can be decreased to ensure that the fourth transistor M4 operates in the linear area, such that the fourth transistor M4 can be fully turned on.

As shown in FIG. 3, the first output circuit 20 comprises: a fifth transistor M5 and a second capacitor C2. The fifth transistor M5 has its first terminal connected to the first clock signal terminal CLK1, its second terminal connected to the first signal output terminal OUTN, and its control terminal connected to the pull-up node PU; and the second capacitor C2 has its one terminal connected to the pull-up node PU and the other terminal connected to the first signal output terminal OUTN.

As shown in FIG. 3, the second pull-down control sub-circuit 422 may comprise a sixth transistor M6 and a seventh transistor M7, wherein a control terminal and a first terminal of the sixth transistor M6 are connected to the second clock signal terminal, a second terminal of the sixth transistor M6 is connected to the pull-down control node NET3, a first terminal of the seventh transistor M7 is connected to the pull-down node PD, a second terminal of the seventh transistor M7 is connected to the second clock signal terminal CLK2, and a control terminal of the seventh transistor M7 is connected to the pull-down control node NET3; the first pull-down control sub-circuit 421 comprises an eighth transistor M8 and a ninth transistor M9, wherein a first terminal of the eighth transistor M8 is connected to the low voltage signal terminal Vss, a second terminal of the eighth transistor M8 is connected to the pull-down node PD, a control terminal of the eighth transistor M8 is connected to the pull-up node PU, a first terminal of the ninth transistor M9 is connected to the pull-down control node NET3, a second terminal of the ninth transistor M9 is connected to the low voltage signal terminal Vss, and a control terminal of the ninth transistor M9 is connected to the pull-up node PU.

As shown in FIG. 3, the first denoising circuit 43 may comprise: a tenth transistor M10 and an eleventh transistor M11, wherein the tenth transistor M10 has its first terminal connected to the low voltage signal terminal Vss, its second terminal connected to the first signal output terminal OUTN, and its control terminal connected to the pull-down node PD; and the eleventh transistor M11 has its first terminal connected to the low voltage signal terminal Vss, its second terminal connected to the pull-up node PU, and its control terminal connected to the pull-down node PD.

As shown in FIG. 3, the second denoising circuit 44 may comprise: a twelfth transistor M12 and a thirteenth transistor M13, wherein the twelfth transistor M12 has its first terminal connected to the first signal output terminal OUTN, its second terminal connected to the low voltage signal terminal Vss, and its control terminal connected to the second clock signal terminal CLK2; and the thirteenth transistor M13 has its first terminal connected to the first signal input terminal IN2, its second terminal connected to the pull-up node PU, and its control terminal connected to the second clock signal terminal CLK2.

As shown in FIG. 3, the pull-down circuit 41 may comprise: a fourteenth transistor M14 and a fifteenth transistor M15, wherein the fourteenth transistor M14 has its first terminal connected to the first signal output terminal OUTN, its second terminal connected to the low voltage signal terminal Vss, and its control terminal connected to the reset signal terminal Reset; and the fifteenth transistor M15 has its first terminal connected to the pull-up node PU, its second terminal connected to the low voltage signal terminal Vss and its control terminal connected to the reset signal terminal Reset.

As shown in FIG. 3, the input circuit 10 may comprise: a sixteenth transistor M16, wherein a first terminal and a control terminal of the sixteenth transistor M16 are connected to the first signal input terminal IN1, and a second terminal of the sixteenth transistor M16 is connected to the pull-up node PU.

Figure 4:
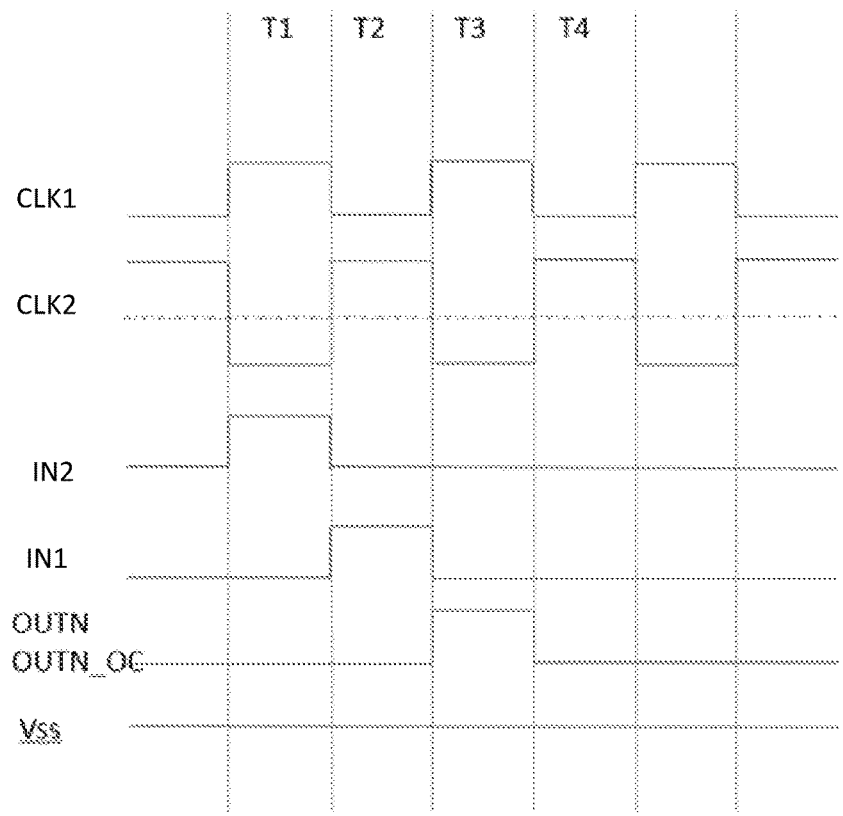
FIG. 4 is a control sequence diagram of a shift register according to an embodiment of the present disclosure.

FIG. 4 is a control sequence diagram of a shift register according to an embodiment of the present disclosure. Now the working principle of the embodiment shown in FIG. 3 will be further described in conjunction with the sequence diagram shown in FIG. 4.

In a first stage T1, a high level is input into the first clock signal terminal CLK1, a low level is input into the second clock signal terminal CLK2, a low level is input into the first signal input terminal IN1, and a high level is input into the second signal input terminal IN2, so the first transistor M1, the second transistor M2 and the third transistor M3 are in the ON state, then the first capacitor C1 is charged according to the high level input into the second signal input terminal IN2. The voltage of the control terminal (i.e. gate) of the fourth transistor M4 is the charging voltage V1 of the first capacitor C1 (i.e. the potential on the second terminal of the first capacitor C1), that is, the gate voltage of the fourth transistor M4 is at a high level V1.

In a second stage T2, a low level is input into the first clock signal terminal CLK1, a high level is input into the second clock signal terminal CLK2, a high level is input into the first signal input terminal IN1, and a low level is input into the second signal input terminal IN2, so the first transistor M1, the second transistor M2 and the third transistor M3 are in the OFF state and the sixteenth transistor M16 is turned on, then the high level of the first signal input terminal IN1 is written into the pull-up node PU through the sixteenth transistor M16, so that the pull-up node PU is at another high level V2. Under the effect of the first capacitor C1, the gate voltage of the fourth transistor M4 is the sum of the voltage of the pull-up node PU and the charging voltage of the first capacitor, i.e. V1+V2.

Since the second clock signal terminal CLK2 is at a high level, the twelfth transistor M12 and the thirteenth transistor M13 are turned on. Thus the first signal output terminal OUTN can be denoised through the twelfth transistor M12, and by connecting the thirteenth transistor M13 and the sixteenth transistor M16 in parallel, the high level of the first signal input terminal IN1 can be written faster into the pull-up node PU.

In a third stage T3, a high level is input into the first clock signal terminal CLK1, a low level is input into the second clock signal terminal CLK2, and a low level is input into both the first signal input terminal IN1 and the second signal input terminal IN2, at this point, since the gate voltage of the fourth transistor M4 is V1+V2, the fourth transistor M4 is fully turned on, thus the high level of the first clock signal terminal CLK1 is output through the second signal output terminal OUTN_OC, ensuring that the fourth transistor M4 still has good output capability when working at a low temperature and ensuring that the second signal output terminal OUTN_OC can quickly output the first clock signal, thereby enhancing the capability of transmitting and outputting line by line in low temperature environment and realizing stable output at ultra-low temperature.

Since the fifth transistor M5 is turned on under the control of the pull-up node PU, the high level of the first clock signal terminal CLK1 is output through the first signal output terminal OUTN.

It shall be understood that when the pull-up node PU is of a high level, the eighth transistor M8 and the ninth transistor M9 are turned on, and the voltage of the pull-down node PD is pulled down by means of the voltage of the low voltage signal terminal Vss. When the level of the pull-up node PU becomes low, and the second clock signal terminal CLK2 is at a high level, since the eighth transistor M8 and the ninth transistor M9 are turned off while the sixth transistor M6 and the seventh transistor M7 are turned on, the voltage of the pull-down node PD can be pulled up by means of the high level of the second clock signal terminal CLK2.

In a fourth stage T4, a low level is input into the first clock signal terminal CLK1, a high level is input into the second clock signal terminal CLK2, and a low level is input into both the first signal input terminal IN1 and the second signal input terminal IN2, at this point, then the eighth transistor M8 and the ninth transistor M9 are turned off, while the sixth transistor M6 and the seventh transistor M7 are turned on, the voltage of the pull-down node PD is pulled up to a high level, and the tenth transistor M10 and the eleventh transistor M11 are turned on, meanwhile, the twelfth transistor M12 and the thirteenth transistor M13 are also turned on, thus the pull-up node PU and the first signal output terminal OUTN can be denoised by turning on the tenth transistor M10 and the eleventh transistor M11 and by turning on the twelfth transistor M12 and the thirteenth transistor M13.

In addition, when a high level is input into the reset signal terminal Reset, the fourteenth transistor M14 and the fifteenth transistor M15 are turned on, and the voltage of the low voltage signal terminal Vss is written into the first signal output terminal OUTN and the pull-up node PU, respectively so as to reset the first signal output terminal OUTN and the pull-up node PU.

In summary, in the shift register described in the embodiments of the present disclosure, the output drive circuit writes the voltage of the second signal input terminal into the control terminal of the second output circuit under the control of the second input signal provided at the second signal input terminal, and superimposes the voltage of the pull-up node onto the control terminal of the second output circuit, so that the second output circuit is fully turned on to ensure that the shift register has good output capability when working at a low temperature and ensure that the shift register can quickly output signals, accordingly, the capability of sustained transmission of the gate drive circuit can be enhanced, and stable output of the gate drive circuit at low temperature is realized, which meets the need of product design under extreme working environments.

Figure 5:
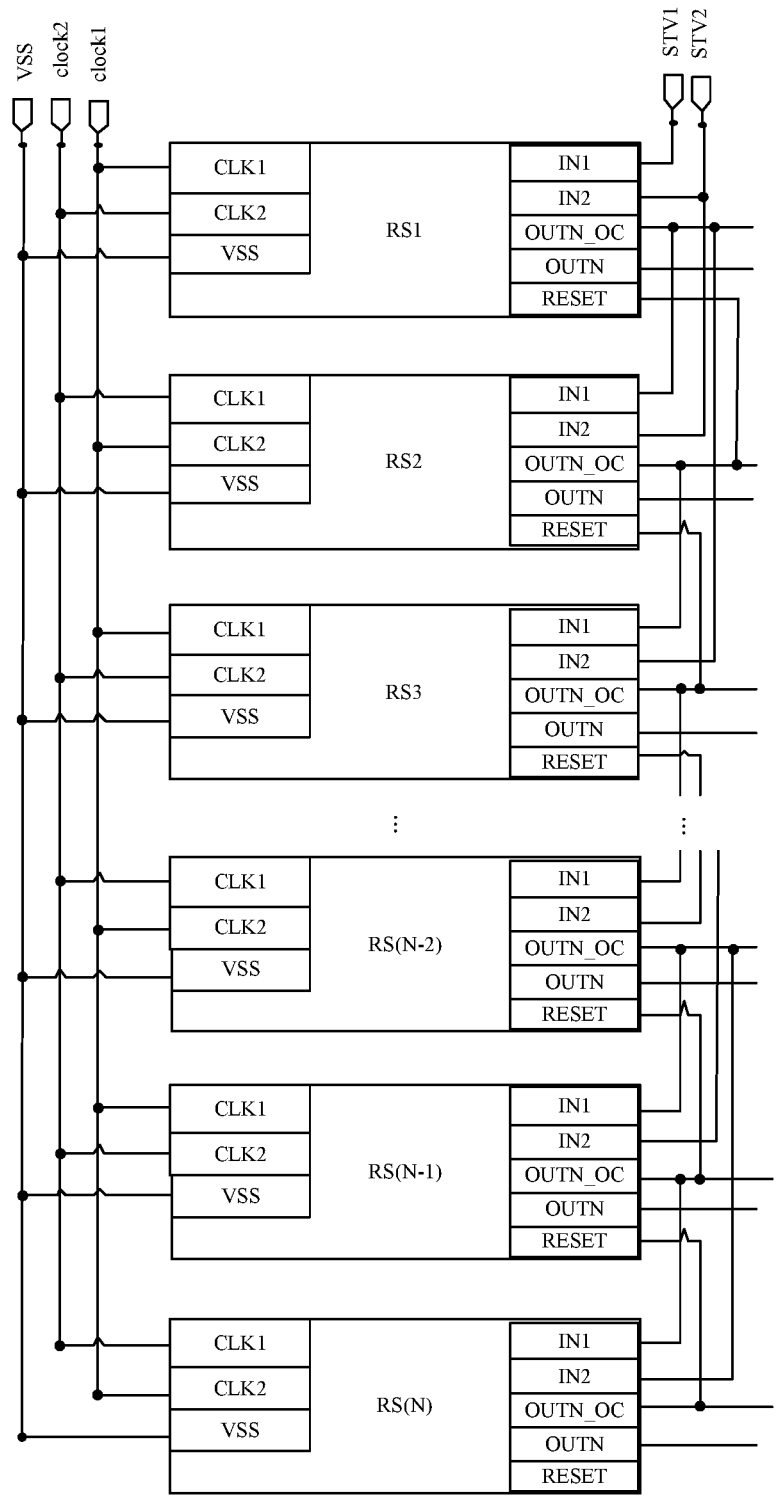
FIG. 5 is a circuit principle diagram of a gate drive circuit according to an embodiment of the present disclosure.

Based on the shift register of the above embodiments, the present disclosure also provides a gate drive circuit. The gate drive circuit comprises multiple stages of shift registers described in any of the above embodiments, as shown in FIG. 5. Said multiple stages of shift registers are cascaded, wherein except for the shift register of the first stage, the first signal input terminal of the shift register of each of the rest stages is connected to the second signal output terminal of the shift register of the previous stage; and except for shift registers of the first stage and the second stage, the second signal input terminal of the shift register of each of the rest stages is connected to the second signal output terminal of the shift register before the shift register of the previous stage. In FIG. 5, clock 1 and clock 2 are reverse clock signals of each other, referring to the example shown by CLK1 and CLK2 in FIG. 4, STV1 and STV2 are frame start signals, wherein STV1 is provided before STV2. In addition, except for the first stage, the second signal output terminal of the shift register of each of the rest stages is connected to the reset signal terminal Reset of the shift register of the previous stage to reset it.

In the gate drive circuit provided in the embodiment of the present disclosure, the shift register described in the above embodiments is used to ensure that the shift register has good output capability when working at a low temperature and ensure that the shift register can quickly output signals, thus the capability of sustained transmission of the gate drive circuit can be enhanced, and stable output of the gate drive circuit at low temperature is realized, which meets the need of product design under extreme working environments.

The present disclosure also provides a display device, which comprises the gate drive circuit described in any of the above embodiments.

In the display device provided in the embodiment of the present disclosure, the gate drive circuit described in the above embodiments is used to ensure that the shift register has good output capability when working at a low temperature and ensure that the shift register can quickly output signals, thus the capability of sustained transmission of the gate drive circuit can be enhanced, and stable output of the gate drive circuit at low temperature is realized, which meets the need of product design under extreme working environments.

Based on the shift register described in the above embodiments, an embodiment of the present disclosure further provides a method for controlling the shift register. FIG. 6 is a flow chart of a method for controlling the shift register according to an embodiment of the present disclosure. As shown in FIG. 6, the method for controlling the shift register comprises: S1: in a first stage, inputting a first turn-on voltage into the first clock signal terminal, inputting a second turn-off voltage into the second clock signal terminal, inputting a third voltage into the first signal input terminal, and inputting a fourth voltage into the second signal input terminal, so that the first capacitor in the output drive circuit is charged by the fourth voltage input into the second signal input terminal, then the voltage of the control terminal of the second output circuit is the charging voltage of the first capacitor; S2: in a second stage, inputting a first turn-off voltage into the first clock signal terminal, inputting a second turn-on voltage into the second clock signal terminal, inputting a fourth voltage into the first signal input terminal, and inputting a third voltage into the second signal input terminal, so that the voltage of the first signal input terminal is written into the pull-up node to make the voltage on the control terminal of the second output circuit to be a sum of the voltage of the pull-up node and the charging voltage of the first capacitor; S3: in a third stage, inputting the first turn-on voltage into the first clock signal terminal, inputting the second turn-off voltage into the second clock signal terminal, inputting the third voltage into both the first signal input terminal and the second signal input terminal, so that the voltage of the first clock signal terminal is written into the second signal output terminal through the second output circuit.

It shall be understood that in the descriptions of the present disclosure, the directional or positional relations indicated by such terms as "on", "under", "front", "back" are directional or positional relations as shown in the drawings, and said terms are merely used for facilitating description of the present disclosure and for simplifying the description, but they do not indicate or suggest that the described device or element must have a specific direction and position or be constructed and operated in a specific direction and position, so they shall not be construed as limiting the present disclosure.

Moreover, the terms "first" and "second" are used for descriptive purposes only, but they shall not be construed as indicating or suggesting any relative importance or implying the number of the described technical features. Therefore, the features defined by "first" and "second" may explicitly or implicitly include one or more of said features. In the descriptions herein, the word "multiple" means two or more, unless otherwise defined.

In this specification, descriptions made with reference to "one embodiment", "some embodiments", "an example", "a specific example", "some examples", etc. mean that the specific features, structures, materials or characteristics described with reference to said embodiment or example are included in at least one embodiment or example of the present disclosure. In this specification, schematic expressions of the above terms are not necessarily used for the same embodiment or example. Moreover, the described specific features, structures, materials or characteristics can be combined in appropriate ways in any one or more embodiments or examples. In addition, those skilled in the art can combine different embodiments or examples and features of different embodiments or examples described in this specification as long as no confliction is caused.

Although the embodiments of the present disclosure have been illustrated and described in the text above, it shall be appreciated that the above embodiments are exemplary but they do not intend to limit the present disclosure. Those ordinarily skilled in the art can make changes, modifications, replacements and variations to the above embodiments without departing from the scope of the present disclosure.

What is claimed is:

1. A shift register, comprising:
    an input circuit connected to a first signal input terminal and a pull-up node, and configured to write a voltage of the first signal input terminal to the pull-up node responsive to a first input signal provided at the first signal input terminal;
    a first output circuit connected to the pull-up node, a first clock signal terminal and a first signal output terminal, and configured to write a voltage of the first clock signal terminal to the first signal output terminal responsive to a voltage of the pull-up node;
    a second output circuit connected to the first clock signal terminal and a second signal output terminal, and configured to write the voltage of the first clock signal terminal to the second signal output terminal responsive to a voltage of a control terminal of the second output circuit;
    a control circuit connected to a second clock signal terminal, the pull-up node, a reset signal terminal, a low voltage signal terminal and the first signal output terminal, and configured to control voltages of the first signal output terminal and the pull-up node responsive to a second clock signal provided at the second clock signal terminal and a voltage of the reset signal terminal;
    an output drive circuit connected to a second signal input terminal, the pull-up node, a control terminal of the second output circuit and the low voltage signal terminal, and configured to write a voltage of the second signal input terminal to the control terminal of the second output circuit and provide the voltage of the pull-up node to the control terminal of the second output circuit responsive to a second input signal provided at the second signal input terminal.

2. The shift register according to claim 1, wherein the control circuit comprises:
    a pull-down circuit which is connected to the reset signal terminal, the low voltage signal terminal, the pull-up node and the first signal output terminal, and is configured to write a voltage of the low voltage signal terminal to the first signal output terminal and the pull-up node responsive to a voltage of the reset signal terminal;
    a pull-down control circuit which is connected to the second clock signal terminal, the pull-up node, a pull-down node and the low voltage signal terminal, and is configured to write a voltage of the second clock signal terminal to the pull-down node responsive to the second clock signal provided at the second clock signal terminal and to write the voltage of the low voltage signal terminal to the pull-down node responsive to the voltage of the pull-up node;
    a first denoising circuit which is connected to the pull-down node, the pull-up node, the low voltage signal terminal and the first signal output terminal, and is configured to denoise the pull-up node and the first signal output terminal responsive to a voltage of the pull-down node.

3. The shift register according to claim 2, wherein the control circuit further comprises:
    a second denoising circuit which is connected to the pull-up node, the first signal input terminal, the low voltage signal terminal, the first signal output terminal and the second clock signal terminal, and is configured to denoise the first signal output terminal based on the second clock signal provided at the second clock signal terminal.

4. The shift register according to claim 3, wherein the second denoising circuit comprises:
    a twelfth transistor comprising a first terminal of the twelfth transistor connected to the first signal output terminal, a second terminal of the twelfth transistor connected to the low voltage signal terminal, and a control terminal of the twelfth transistor connected to the second clock signal terminal; and
    a thirteenth transistor comprising a first terminal of the thirteenth transistor connected to the first signal input terminal, a second terminal of the thirteenth transistor connected to the pull-up node, and a control terminal of the thirteenth transistor connected to the second clock signal terminal.

5. The shift register according to claim 2,
    wherein the pull-down control circuit comprises a first pull-down control sub-circuit and a second pull-down control sub-circuit,
    wherein the second pull-down control sub-circuit is connected to the second clock signal terminal, a pull-down control node and the pull-down node, and is configured to change a voltage of the pull-down control node responsive to the second clock signal provided at the second clock signal terminal,
    wherein the first pull-down control sub-circuit is connected to the pull-down control node, the pull-up node, the pull-down node and the low voltage signal terminal, and is configured to change the voltage of the pull-down node responsive to the pull-up node and the pull-down control node, wherein the second pull-down control sub-circuit comprises a sixth transistor and a seventh transistor,
wherein a control terminal of the sixth transistor and a first terminal of the sixth transistor are connected to the second clock signal terminal,
wherein a second terminal of the sixth transistor is connected to the pull-down control node,
wherein a first terminal of the seventh transistor is connected to the pull-down node,
wherein a second terminal of the seventh transistor is connected to the second clock signal terminal,
wherein a control terminal of the seventh transistor is connected to the pull-down control node,
wherein the first pull-down control sub-circuit comprises an eighth transistor and a ninth transistor,
wherein a first terminal of the eighth transistor is connected to the low voltage signal terminal,
wherein a second terminal of the eighth transistor is connected to the pull-down node,
wherein a control terminal of the eighth transistor is connected to the pull-up node,
wherein a first terminal of the ninth transistor is connected to the pull-down control node,
wherein a second terminal of the ninth transistor is connected to the low voltage signal terminal, and
wherein a control terminal of the ninth transistor is connected to the pull-up node.

6. The shift register according to claim 2, wherein the first denoising circuit comprises:
a tenth transistor comprising a first terminal of the tenth transistor connected to the low voltage signal terminal, a second terminal of the tenth transistor connected to the first signal output terminal, and a control terminal of the tenth transistor connected to the pull-down node; and
an eleventh transistor comprising a first terminal of the eleventh transistor connected to the low voltage signal terminal, a second terminal of the eleventh transistor connected to the pull-up node, and a control terminal of the eleventh transistor connected to the pull-down node.

7. The shift register according to claim 2, wherein the pull-down circuit comprises:
a fourteenth transistor comprising a first terminal of the fourteenth transistor connected to the first signal output terminal, a second terminal of the fourteenth transistor connected to the low voltage signal terminal, and a control terminal of the fourteenth transistor connected to the reset signal terminal;
a fifteenth transistor comprising a first terminal of the fifteenth transistor connected to the pull-up node, a second terminal of the fifteenth transistor connected to the low voltage signal terminal and a control terminal of the fifteenth transistor connected to the reset signal terminal.

8. The shift register according to claim 1, wherein the output drive circuit comprises:
a first transistor comprising a first terminal of the first transistor and a control terminal of the first transistor connected to the second signal input terminal and a second terminal of the first transistor connected to a control terminal of the second output circuit;
a second transistor comprising a first terminal of the second transistor connected to the control terminal of the second output circuit, a second terminal of the second transistor connected to the low voltage signal terminal, and a control terminal of the second transistor connected to the second signal input terminal;
a third transistor comprising a first terminal of the third transistor connected to the pull-up node, a second terminal of the third transistor connected to the low voltage signal terminal, and a control terminal of the third transistor connected to the second signal input terminal; and
a first capacitor comprising a first terminal of the first capacitor connected to the pull-up node and a second terminal of the first capacitor connected to the control terminal of the second output circuit.

9. The shift register according to claim 1, wherein the second output circuit comprises:
a fourth transistor comprising a first terminal of the fourth transistor connected to the first clock signal terminal, a second terminal of the fourth transistor connected to the second signal output terminal, and a control terminal of the fourth transistor serving as the control terminal of the second output circuit.

10. The shift register according to claim 1, wherein the first output circuit comprises:
a fifth transistor comprising a first terminal of the fifth transistor connected to the first clock signal terminal, a second terminal of the fifth transistor connected to the first signal output terminal, and a control terminal of the fifth transistor connected to the pull-up node; and
a second capacitor comprising a first terminal of the second capacitor connected to the pull-up node and a second terminal of the second capacitor connected to the first signal output terminal.

11. The shift register according to claim 1, wherein the input circuit comprises:
a sixteenth transistor comprising a first terminal of the sixteenth transistor and a control terminal of the sixteenth transistor connected to the first signal input terminal, and a second terminal of the sixteenth transistor connected to the pull-up node.

12. A gate drive circuit, comprising multiple stages of the shift register of claim 1,
wherein except for a first shift register of a first stage of the multiple stages, a first signal input terminal of the shift register of each of remaining ones of the multiple stages is connected to the second signal output terminal of a shift register of a previous stage;
except for shift registers of the first stage and a second stage of the multiple stages, a second signal input terminal of the shift register of each of the remaining ones of the multiple stages is connected to the second signal output terminal of the shift register before the shift register of the previous stage.

13. A display device, comprising the gate drive circuit of claim 12.

14. The gate drive circuit according to claim 12, wherein the control circuit comprises:
a pull-down circuit which is connected to the reset signal terminal, the low voltage signal terminal, the pull-up node and the first signal output terminal, and is configured to write the voltage of the low voltage signal terminal to the first signal output terminal and the pull-up node responsive to the voltage of the reset signal terminal;
a pull-down control circuit which is connected to the second clock signal terminal, the pull-up node, the pull-down node and the low voltage signal terminal, and is configured to write the voltage of the second clock signal terminal to the pull-down node responsive to the second clock signal provided at the second clock signal terminal and to write the voltage of the low voltage signal terminal to the pull-down node responsive to the voltage of the pull-up node;

a first denoising circuit which is connected to the pull-down node, the pull-up node, the low voltage signal terminal and the first signal output terminal, and is configured to denoise the pull-up node and the first signal output terminal responsive to the voltage of the pull-down node.

15. The gate drive circuit according to claim 14, wherein the control circuit further comprises:

a second denoising circuit which is connected to the pull-up node, the first signal input terminal, the low voltage signal terminal, the first signal output terminal and the second clock signal terminal, and is configured to denoise the first signal output terminal based on the second clock signal provided at the second clock signal terminal.

16. The gate drive circuit according to claim 14, wherein the pull-down control circuit comprises the first pull-down control sub-circuit and the second pull-down control sub-circuit, wherein the second pull-down control sub-circuit is connected to the second clock signal terminal, the pull-down control node and the pull-down node, and is configured to change the voltage of the pull-down control node responsive to the second clock signal provided at the second clock signal terminal, wherein the first pull-down control sub-circuit is connected to the pull-down control node, the pull-up node, the pull-down node and the low voltage signal terminal, and is configured to change the voltage of the pull-down node responsive to the pull-up node and the pull-down control node, wherein the second pull-down control sub-circuit comprises a sixth transistor and a seventh transistor, wherein a control terminal and a first terminal of the sixth transistor are connected to the second clock signal terminal, wherein a second terminal of the sixth transistor is connected to the pull-down control node, wherein a first terminal of the seventh transistor is connected to the pull-down node, wherein a second terminal of the seventh transistor is connected to the second clock signal terminal, wherein a control terminal of the seventh transistor is connected to the pull-down control node, wherein the first pull-down control sub-circuit comprises an eighth transistor and a ninth transistor, wherein a first terminal of the eighth transistor is connected to the low voltage signal terminal, wherein a second terminal of the eighth transistor is connected to the pull-down node, wherein a control terminal of the eighth transistor is connected to the pull-up node, wherein a first terminal of the ninth transistor is connected to the pull-down control node, wherein a second terminal of the ninth transistor is connected to the low voltage signal terminal, and wherein a control terminal of the ninth transistor is connected to the pull-up node.

17. The gate drive circuit according to claim 12, wherein the output drive circuit comprises:

a first transistor comprising a first terminal of the first transistor and control terminal of the first transistor connected to the second signal input terminal and a second terminal of the first transistor connected to the control terminal of the second output circuit;

a second transistor comprising a first terminal of the second transistor connected to the control terminal of the second output circuit, a second terminal of the second transistor connected to the low voltage signal terminal, and a control terminal of the second transistor connected to the second signal input terminal;

a third transistor comprising a first terminal of the third transistor connected to the pull-up node, a second terminal of the third transistor connected to the low voltage signal terminal, and a control terminal of the third transistor connected to the second signal input terminal;

a first capacitor comprising a first terminal of the first capacitor connected to the pull-up node and a second terminal of the first capacitor connected to the control terminal of the second output circuit.

18. The gate drive circuit according to claim 12, wherein the second output circuit comprises:

a fourth transistor comprising a first terminal of the fourth transistor connected to the first clock signal terminal, a second terminal of the fourth transistor connected to the second signal output terminal, and a control terminal of the fourth transistor serving as the control terminal of the second output circuit.

19. The gate drive circuit according to claim 12, wherein the first output circuit comprises:

a fifth transistor comprising a first terminal of the fifth transistor connected to the first clock signal terminal, a second terminal of the fifth transistor connected to the first signal output terminal, and a control terminal of the fifth transistor connected to the pull-up node;

a second capacitor comprising a first terminal of the second capacitor connected to the pull-up node and a second terminal of the second capacitor connected to the first signal output terminal.

20. A method for controlling the shift register of claim 1, comprising:

in a first stage, inputting a first turn-on voltage to the first clock signal terminal, inputting a second turn-off voltage to the second clock signal terminal, inputting a third voltage to the first signal input terminal, and inputting a fourth voltage to the second signal input terminal, so that a first capacitor in the output drive circuit is charged by the fourth voltage input to the second signal input terminal and that the voltage of the control terminal of the second output circuit is a charging voltage of the first capacitor;

in a second stage, inputting a first turn-off voltage to the first clock signal terminal, inputting a second turn-on voltage to the second clock signal terminal, inputting the fourth voltage to the first signal input terminal, and inputting the third voltage to the second signal input terminal, so that the voltage of the first signal input terminal is written to the pull-up node to make the voltage on the control terminal of the second output circuit to be a sum of the voltage of the pull-up node and the charging voltage of the first capacitor;

in a third stage, inputting the first turn-on voltage to the first clock signal terminal, inputting the second turn-off voltage to the second clock signal terminal, inputting the third voltage to both the first signal input terminal and the second signal input terminal, so that the voltage of the first clock signal terminal is written to the second signal output terminal through the second output circuit.

\* \* \* \* \*